United States Patent
Yang

(10) Patent No.: US 8,844,123 B2
(45) Date of Patent: Sep. 30, 2014

(54) METHOD OF MANUFACTURING A HOLLOW SURFACE MOUNT TYPE ELECTRONIC COMPONENT

(76) Inventor: Chin-Chi Yang, Wufong Hsiang (TW)

(*) Notice: Subject to any disclaimer, the term of this patent is extended or adjusted under 35 U.S.C. 154(b) by 1335 days.

(21) Appl. No.: 12/592,821

(22) Filed: Dec. 3, 2009

(65) Prior Publication Data

US 2011/0131803 A1    Jun. 9, 2011

(51) Int. Cl.
*H05K 3/30* (2006.01)
*H05K 3/36* (2006.01)
*H05K 13/04* (2006.01)
*H01L 21/50* (2006.01)

(52) U.S. Cl.
CPC ........................ *H01L 21/50* (2013.01)
USPC ............. 29/832; 29/830; 29/831; 29/841; 174/50.5; 174/260; 438/110; 438/112; 438/113; 156/250; 156/257; 156/268; 156/307.3

(58) Field of Classification Search
USPC ........ 29/830, 831, 832, 841; 174/50.5–50.54, 174/521, 535, 260; 438/110, 112, 113, 127; 257/797, 723, 724, 731, 787, 788; 156/250, 252, 253, 256, 257, 268; 156/307.3, 307.5
See application file for complete search history.

(56) References Cited

U.S. PATENT DOCUMENTS

| | | | | |
|---|---|---|---|---|
| 6,777,265 | B2 * | 8/2004 | Islam et al. | 438/111 |
| 7,001,797 | B2 * | 2/2006 | Hashimoto | 438/113 |
| 7,081,374 | B2 * | 7/2006 | Yamaguchi | 438/113 |
| 7,679,178 | B2 * | 3/2010 | Pu et al. | 257/686 |
| 7,749,882 | B2 * | 7/2010 | Kweon et al. | 438/597 |
| 7,934,306 | B2 * | 5/2011 | Wu | 29/594 |
| 8,183,092 | B2 * | 5/2012 | Huang et al. | 438/113 |
| 2003/0224540 | A1 * | 12/2003 | Watanabe et al. | 438/7 |
| 2004/0099917 | A1 * | 5/2004 | Greathouse et al. | 257/414 |
| 2005/0133932 | A1 * | 6/2005 | Pohl et al. | 257/777 |
| 2011/0234329 | A1 * | 9/2011 | Fukuda | 331/156 |

* cited by examiner

*Primary Examiner* — Peter DungBa Vo
*Assistant Examiner* — Kaying Kue
(74) *Attorney, Agent, or Firm* — William E. Pelton; Cooper & Dunham LLP

(57) ABSTRACT

A method of manufacturing a hollow surface mount type electronic component has a preparing step, a gluing step and a cutting step. The preparing step includes preparing a baseboard, a clapboard and a cover board, mounting multiple circuit segments and conducting points on two opposite faces of the baseboard at intervals and boring multiple through holes on the clapboard corresponding to the circuit segments. The gluing step includes mounting multiple electronic elements on the baseboard to connected with the circuit segments, gelatinizing glue on the boards to mount the clapboard between the baseboard and the cover board and pressing the boards by a pressing machine. The cutting step includes cutting the boards by a cutting machine to produce multiple single SDM electronic components.

20 Claims, 6 Drawing Sheets

METHOD OF MANUFACTURING A HOLLOW SURFACE MOUNT TYPE ELECTRONIC COMPONENT

BACKGROUND OF THE INVENTION

1. Field of the Invention

The present invention relates to a method of manufacturing a hollow surface mount type (SMD) electronic component, and more particularly to a method that can be processed conveniently and can provide a preferred quality and a high capacity ratio.

2. Description of the Prior Arts

In order to meet the tendency of micro-minimizing and simplifying of integrated circuits (IC) and electronic products, plugging type electronic components on a printed circuit board (PCB) have become surface mount type (SMD) electronic components that are mounted on a surface of the printed circuit board. The SMD electronic components have advantages of low impedance, high capacity, miniaturization and long life span. Therefore, the conventional SMD electronic components are applied to motherboards, CD-ROM drives, modems, monitors and so on.

The conventional SMD electronic components are always packaged in a container or in a sealing material to prevent particles or moisture from surroundings attaching onto the conventional SMD electronic components. The conventional sealing methods include a hermetic sealing method and a non-hermetic sealing method. The hermetic sealing method uses metals or ceramics to seal the conventional SMD electronic components, and this can provide a high stability, but the cost of sealing the conventional SMD electronic components is high. The non-hermetic sealing method is putting the conventional SMD electronic components in a metal mold and injecting a preheated resin into the metal mold to form a protective film around the conventional SMD electronic components. This method can reduce the cost of sealing the conventional SMD electronic components and increase a production rate. Therefore, the non-hermetic sealing method is common in use.

Although the non-hermetic sealing method can provide a protective effect to the conventional SMD electronic components, the high temperature of the heated resin in the sealing process may destroy conventional SMD electronic components. The solidified resin also causes residual stress on the conventional SMD electronic components so increasing the reject ratio of manufacturing the SMD electronic components. For example, an electronic element such as a fuse or a gold bonding line on the SMD electronic components may be broken by the residual stress of the resin. In addition, the resin is soft and easily deformed, when the resin is impacted, the SMD electronic components inside the resin may be broken.

To overcome the shortcomings, the present invention provides a method of manufacturing a hollow surface mount type electronic component to mitigate or obviate the aforementioned problems.

SUMMARY OF THE INVENTION

The main objective of the present invention is to provide a method of manufacturing a hollow surface mount type (SMD) electronic component, and more particularly to a method that can be manufactured conveniently and can provide a preferred quality and a high volume ratio.

The method of manufacturing a hollow surface mount type electronic component in accordance with the present invention comprises a preparing step, a gluing step and a cutting step. The preparing step comprises preparing a baseboard, a clapboard and a cover board, mounting multiple circuit segments and conducting points on two opposite faces of the baseboard at intervals and boring multiple through holes on the clapboard corresponding to the circuit segments. The gluing step comprises mounting multiple electronic elements on the baseboard to connected with the circuit segments, gelatinizing glue on the boards to mount the clapboard between the baseboard and the cover board and pressing the boards by a pressing machine. The cutting step comprises cutting the boards by a cutting machine to produce multiple single SDM electronic components.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
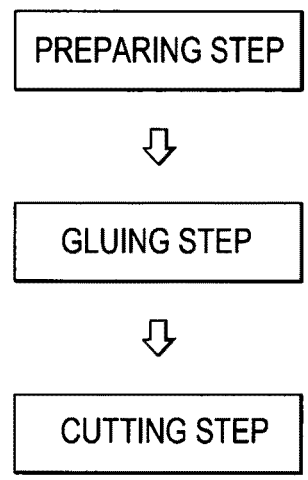
FIG. 1 is a block diagram of a method of manufacturing a hollow surface mount type electronic component in accordance with the present invention.
Figure 2:
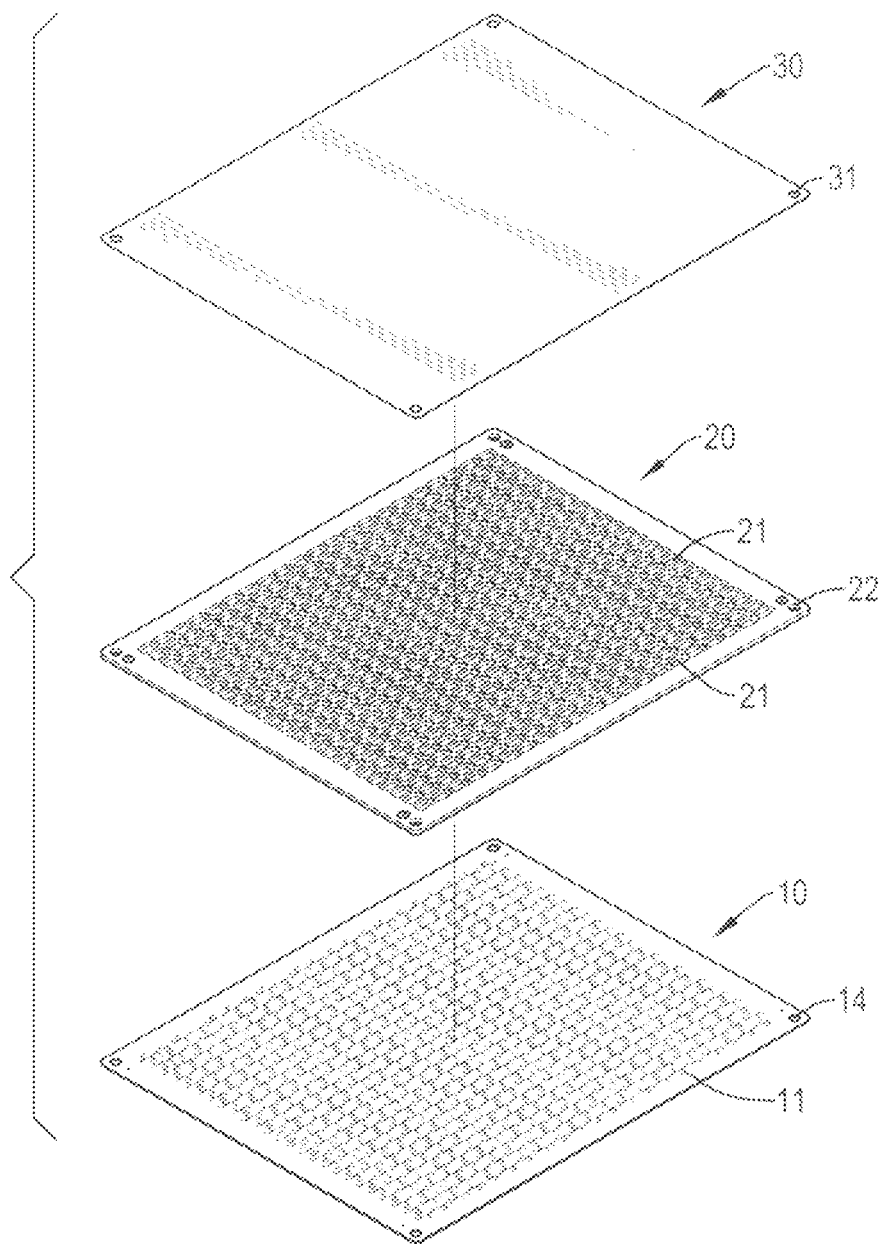
FIG. 2 is an exploded perspective view of the materials in a preparing step of the method in FIG. 1.

With reference to FIGS. 1 and 2, a method of manufacturing a hollow surface mount type (SDM) electronic component in accordance with the present invention comprises a preparing step, a gluing step and a cutting step.

Figure 3:
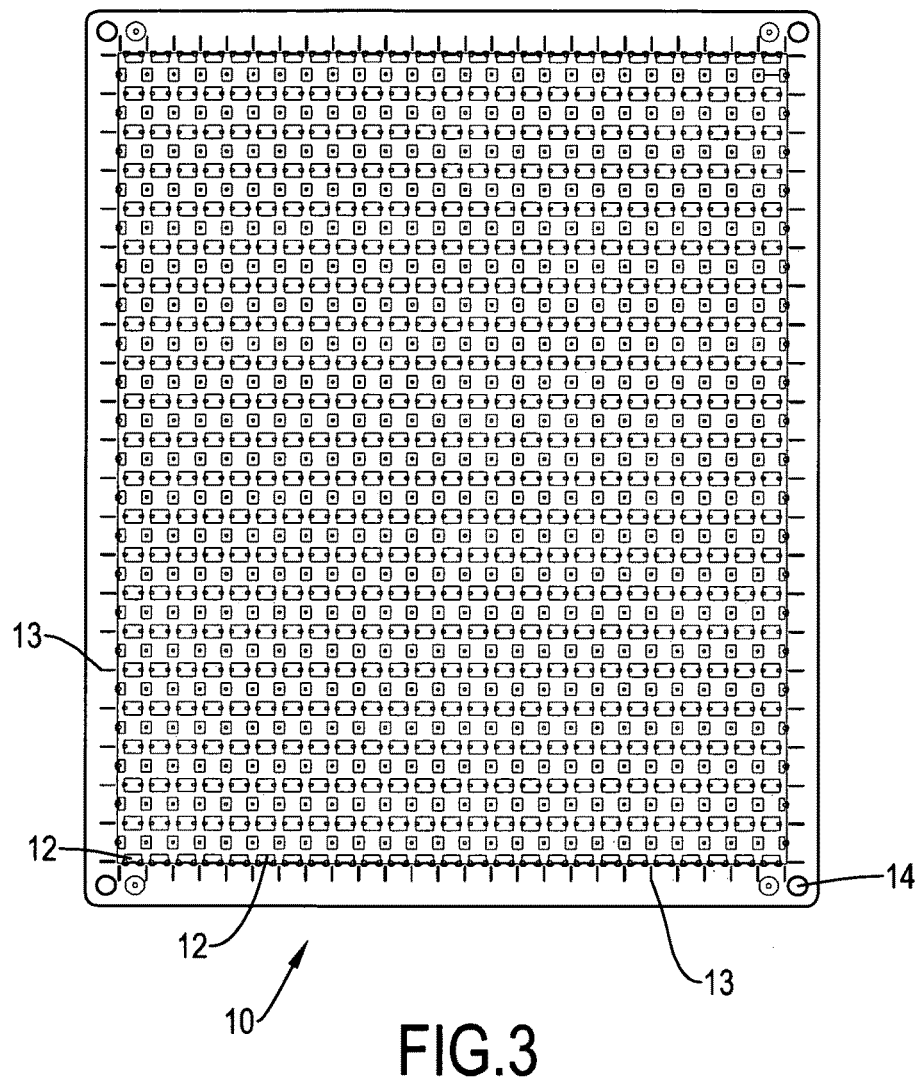
FIG. 3 is a bottom side view of a baseboard in accordance with the present invention.

With further reference to FIG. 3, the preparing step comprises preparing a baseboard (10), a clapboard (20) and a cover board (30), cleaning and drying the boards (10, 20, 30), mounting multiple circuit segments (11) on a top face of the baseboard (10) at intervals, mounting multiple conducting points (12) on a bottom face of the baseboard (10) at intervals and connecting to the circuit segments (11) and marking multiple cutting lines (13) on the bottom face of the baseboard (10) around the conducting points (12).

After the cutting lines (13) are marked on the bottom face of the baseboard (10), multiple through holes (21) are formed on the clapboard (20) corresponding to the circuit segments (11) on the baseboard (10) to form a rib between each pair of adjacent through holes (21) on a center line between two adjacent conducting points (12) on the baseboard (10). The center line between two adjacent conducting points (12) aligns with one of the cutting lines (13). Some of the conducting points (12) are mounted transversely on the bottom face of the baseboard (10) at intervals and the other conducting points (12) are longitudinally mounted on the bottom face of the baseboard (10) at intervals.

Preferably, the baseboard (10) is a printed circuit board (PCB), the cover board (30) may be a composite material board and the shapes and sizes of the boards (10, 20, 30) correspond to each other.

Figure 4:
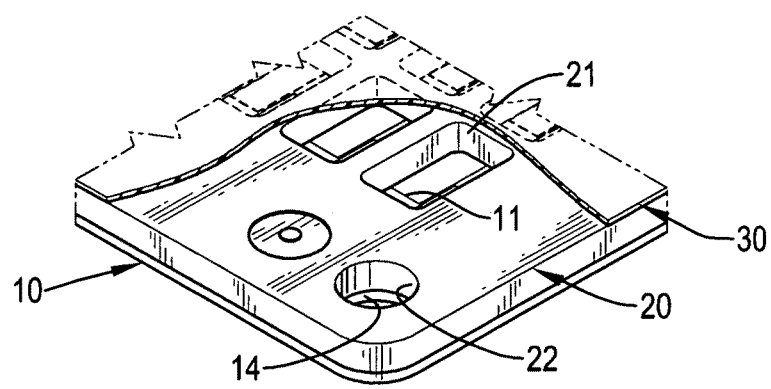
FIG. 4 is an enlarged perspective view of a SDM electronic component in accordance with the present invention without an electronic element.
Figure 5:
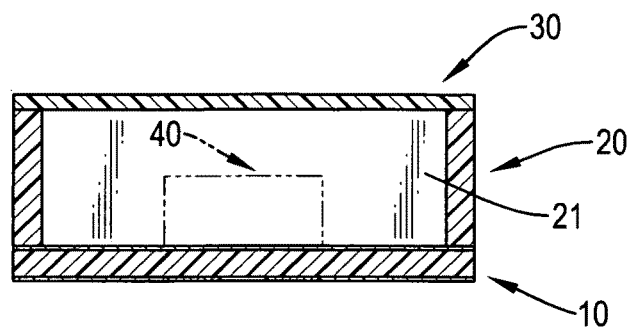
FIG. 5 is a cross sectional side view of the SDM electronic component in FIG. 4.

The gluing step comprises gelatinizing glue on a bottom face of the clapboard (20) and the top face of the baseboard (10), mounting the bottom face of the clapboard (20) on the top face of the baseboard (10) to mount each circuit segment (11) in one of the through holes (21) of the clapboard (20) and putting the combined clapboard (20) and baseboard (10) in a pressing machine. With reference to FIGS. 4 and 5, after the clapboard (20) is pressed with the baseboard (10), multiple electronic elements (40) are mounted on the baseboard (10) to connect with the circuit segments (11) via the through holes (21) of the clapboard (20). Gelatinizing glue on a bottom face of the cover board (30) and a top face of the clapboard (20). The bottom face of the cover board (30) is mounted on the top face of the clapboard (20) and the boards (20, 30) are pressed in the pressing machine to make the cover board (30) securely mounted on the top face of the clapboard (20). Then, the boards (10, 20, 30) are mounted securely with each other. Wherein, each electronic element (40) may be a fuse, a light-emitting diode (LED) or a wafer.

Preferably, the boards (10, 20, 30) are put and pressed in the pressing machine at a temperature of 80° C. to 200° C. for 4 hours.

Preferably, before the cover board (30) is mounted on the clapboard (20), a cooling fin, a cooling glue, a soft glue or an explosion-protection sand is put in the boards (10, 20) between the clapboard (20) and the top face of the baseboard (10). Preferably, the cooling fin may be a copper sheet or a sheet metal.

Figure 6:
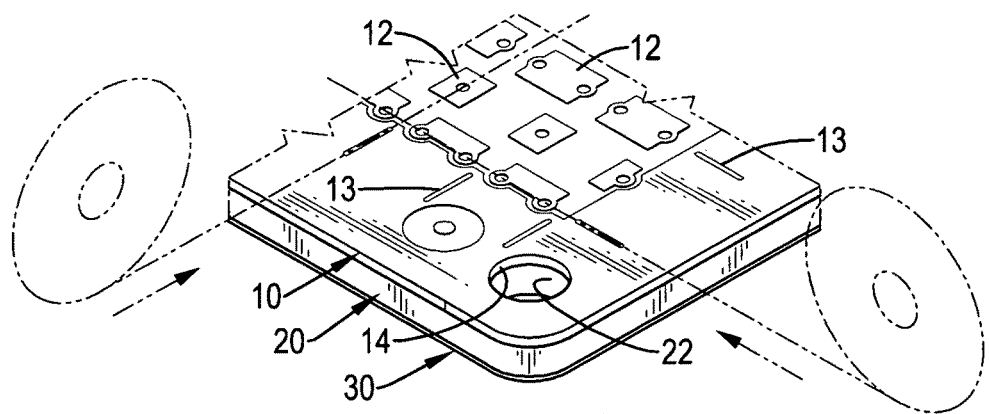
FIG. 6 is an operational perspective view of cutting the SDM electronic component in FIG. 4.

The cutting step comprises forming positioning holes (14, 22, 31) in the corners of the boards (10, 20, 30) and putting the boards (10, 20, 30) on a positioning seat of a cutting machine with the positioning holes (14, 22, 31). With reference to FIG. 6, the boards (10, 20, 30) are cut along the cutting lines (13) on the bottom face of the baseboard (10) by the cutting machine to produce multiple single SDM electronic components.

Figure 7:
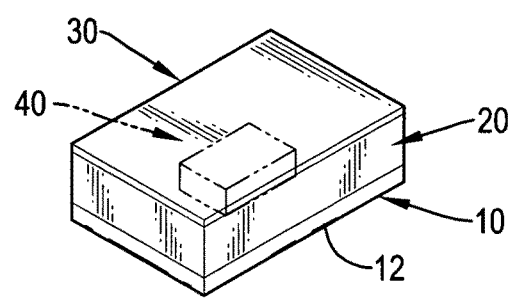
FIG. 7 is a perspective view of a single SDM electronic component in accordance with the present invention.
Figure 8:
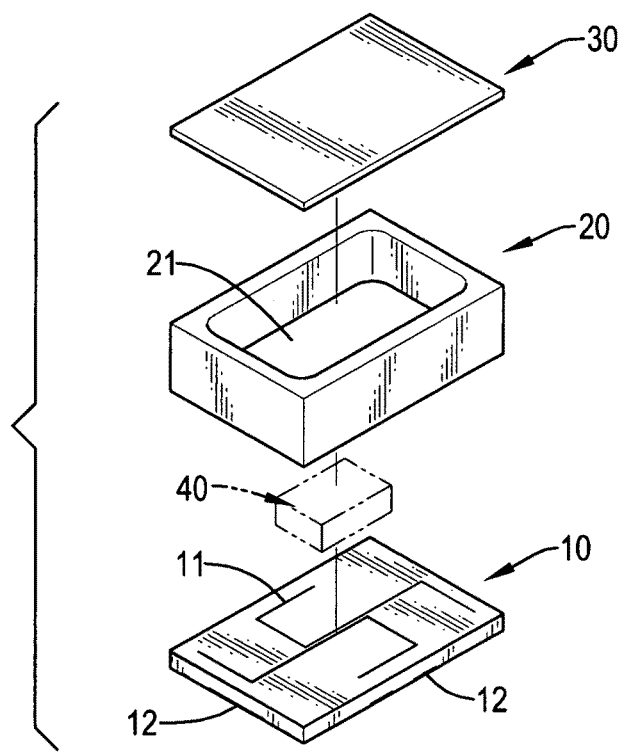
FIG. 8 is an exploded perspective view of the single SDM electronic component in FIG. 7.

With referenced to FIGS. 7 and 8, the present invention further provides a hollow surface mount type (SMD) electronic component, and the SDM electronic component comprises a baseboard (10), a clapboard (20) and a cover board (30).

The baseboard (10) is quadrate and has a top face, a bottom face, a circuit segment (11), at least one conducting point (12) and an electronic element (40). The circuit segment (11) is mounted on the top face of the baseboard (10). The at least one conducting point (12) is mounted on the bottom face of the baseboard (10) and is electrically connected to the circuit segment (11). The electronic element (40) is mounted on the top face of the baseboard (10) and is electrically connected to the circuit segment (11). Preferably, the electronic element (40) is a fuse, a light-emitting diode (LED) or a wafer and the baseboard (10) is a printed circuit board (PCB).

The clapboard (20) is mounted securely on the baseboard (10) and has a bottom, a top, a center, a through hole (21) and an additive. The bottom of the clapboard (20) is mounted securely on the top face of the baseboard (10). The through hole (21) is formed through the center of the clapboard (20) around the circuit segment (11) of the baseboard (10). The additive is mounted in the through hole (21) of the clapboard (20) and may be a cooling fin, a cooling glue, a soft glue or an explosion-protection sand. The cooling fin maybe a copper sheet or a sheet metal.

The cover board (30) may be a composite material board, is mounted securely on the clapboard (20) opposite to the baseboard (10) and has a bottom face mounted on the top of the clapboard (20).

The method of manufacturing a hollow surface mount type electronic component in accordance with the present invention uses manners of gelatinizing and pressing to mount the baseboard (10), the clapboard (20) and the cover board (30) with each other to mount the electronic element (40) inside the boards (10, 20, 30) and this is convenient in manufacture and can provide protection and isolation effects to the electronic element (40) without using resin.

Consequently, the electronic element (40) that is mounted in the space defined by the boards (10, 20, 30) will not be broken by high temperature and residual stress caused by resin. Consequently, a preferred quality of the SDM electronic component in simplified manufacturing steps and at lowered cost is provided. Furthermore, the structural strength of the boards (10, 20, 30) is larger than that of the resin and this can prevent the electronic element (40) from breaking when the SDM electronic component is impacted.

In addition, the hollow clapboard (20) can provide a large space between the baseboard (10) and the cover board (30) to contain electronic elements (40) with a sophisticated structure. For example, a one-to-many fuse, a high voltage type fuse or a high-capacity fuse can be mounted in the space in the clapboard (20) between the baseboard (10) and the cover board (30).

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A method of manufacturing a hollow surface mount type electronic component comprising:
 a preparing step comprising:
  preparing a baseboard, a clapboard and a cover board;
  cleaning and drying the baseboard, the clapboard and the cover board;
  mounting multiple circuit segments on a top face of the baseboard at intervals;
  mounting multiple conducting points on a bottom face of the baseboard at intervals and the conducting points connected to the circuit segments;
  marking multiple cutting lines on the bottom face of the baseboard around the conducting points; and
  forming multiple through holes on the clapboard corresponding to the circuit segments on the baseboard to mount a rib between each pair of adjacent through holes on a center line between two adjacent conducting points on the baseboard, and the center line between two adjacent conducting points aligning with one of the cutting lines;
 a gluing step comprising:
  gelatinizing a first glue on a bottom face of the clapboard and the top face of the baseboard;
  mounting the bottom face of the clapboard on the top face of the baseboard to mount each circuit segment in one of the through holes of the clapboard;
  putting the combined clapboard and baseboard in a pressing machine to press the clapboard with the baseboard;

mounting multiple electronic elements on the baseboard to connect with the circuit segments via the through holes of the clapboard after pressing the clapboard with the baseboard;

gelatinizing a second glue on a bottom face of the cover board and a top face of the clapboard;

mounting the bottom face of the cover board on the top face of the clapboard; and pressing the baseboard, the clapboard and the cover board in the pressing machine to make the cover board and the baseboard securely and respectively mounted on the top face and the bottom faces of the clapboard; and a cutting step comprising:

forming multiple positioning holes in corners of the baseboard, the clapboard and the cover board;

putting the baseboard, the clapboard and the cover board on a positioning seat of a cutting machine;

cutting the baseboard, the clapboard and the cover board along the cutting lines on the bottom face of the baseboard by the cutting machine to produce multiple single SDM electronic components.

2. The method as claimed in claim 1, wherein in the preparing step, some of the conducting points are mounted transversely on the bottom face of the baseboard at intervals and the other conducting points are mounted longitudinally on the bottom face of the baseboard at intervals.

3. The method as claimed in claim 2, wherein in the gluing step, the baseboard, the clapboard and the cover board are pressed in the pressing machine at a temperature of 80° C. to 200° C. for 4 hours.

4. The method as claimed in claim 3, wherein in the gluing step, before the cover board is mounted on the clapboard, a cooling fin is put in the baseboard and the clapboard between the clapboard and the top face of the baseboard.

5. The method as claimed in claim 3, wherein in the gluing step, before the cover board is mounted on the clapboard, a cooling glue is put in the baseboard and the clapboard between the clapboard and the top face of the baseboard.

6. The method as claimed in claim 3, wherein in the gluing step, before the cover board is mounted on the clapboard, a soft glue is put in the baseboard and the clapboard between the clapboard and the top face of the baseboard.

7. The method as claimed in claim 3, wherein in the gluing step, before the cover board is mounted on the clapboard, an explosion-protection sand is put in the baseboard and the clapboard between the through holes of the clapboard and the top face of the baseboard.

8. The method as claimed in claim 4, wherein the gluing step comprises using a fuse as the electronic element.

9. The method as claimed in claim 5, wherein the gluing step comprises using a fuse as the electronic element.

10. The method as claimed in claim 6, wherein the gluing step comprises using a fuse as the electronic element.

11. The method as claimed in claim 7, wherein the gluing step comprises using a fuse as the electronic element.

12. The method as claimed in claim 4, wherein the gluing step comprises using a light-emitting diode (LED) as the electronic element.

13. The method as claimed in claim 5, wherein the gluing step comprises using a light-emitting diode (LED) as the electronic element.

14. The method as claimed in claim 6, wherein the gluing step comprises using a light-emitting diode (LED) as the electronic element.

15. The method as claimed in claim 7, wherein the gluing step comprises using a light-emitting diode (LED) as the electronic element.

16. The method as claimed in claim 4, wherein the gluing step comprises using a wafer as the electronic element.

17. The method as claimed in claim 5, wherein the gluing step comprises using a wafer as the electronic element.

18. The method as claimed in claim 6, wherein the gluing step comprises using a wafer as the electronic element.

19. The method as claimed in claim 7, wherein the gluing step comprises using a wafer as the electronic element.

20. The method as claimed in claim 1, wherein in the gluing step, the baseboard, the clapboard and the cover board are pressed in the pressing machine at a temperature of 80° C. to 200° C. for 4 hours.

* * * * *